(12) United States Patent  
Schulte et al.

(10) Patent No.: US 7,679,426 B2
(45) Date of Patent: Mar. 16, 2010

(54) TRANSISTOR ANTIFUSE DEVICE

(75) Inventors: Donald W. Schulte, Albany, OR (US);
Terry McMahon, Albany, OR (US);
David Douglas Hall, Corvallis, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 536 days.

(21) Appl. No.: 11/039,157

(22) Filed: Jan. 19, 2005

(65) Prior Publication Data
US 2006/0160318 A1 Jul. 20, 2006

(51) Int. Cl.
*H01H 37/76* (2006.01)
*H01H 85/00* (2006.01)
(52) U.S. Cl. ....................................... 327/525
(58) Field of Classification Search ............. 327/525, 327/526; 365/225.7
See application file for complete search history.

(56) References Cited

U.S. PATENT DOCUMENTS

| | | | | |
|---|---|---|---|---|
| 4,013,903 A * | 3/1977 | Sakamoto et al. | ............ | 327/374 |
| 4,246,501 A * | 1/1981 | Baker | ............ | 327/375 |
| 4,742,425 A | 5/1988 | Conzelmann et al. | | |
| 5,229,653 A * | 7/1993 | Lamarche | ............ | 307/116 |
| 5,471,150 A * | 11/1995 | Jung et al. | ............ | 326/87 |
| 5,619,123 A * | 4/1997 | Okamura | ............ | 323/312 |
| 5,663,902 A | 9/1997 | Bennett | | |
| 5,859,562 A * | 1/1999 | McCollum | ............ | 327/525 |
| 5,920,771 A | 7/1999 | Appleman et al. | | |
| 6,128,241 A * | 10/2000 | Choi | ............ | 365/225.7 |
| 6,218,722 B1 | 4/2001 | Cervin-Lawry et al. | | |
| 6,246,243 B1 * | 6/2001 | Audy | ............ | 324/550 |
| 6,590,445 B2 * | 7/2003 | Ueda | ............ | 327/543 |
| 7,136,322 B2 * | 11/2006 | Brennan et al. | ............ | 365/225.7 |
| 7,157,782 B1 * | 1/2007 | Shih et al. | ............ | 257/530 |
| 7,180,361 B2 * | 2/2007 | Takai | ............ | 327/525 |
| 7,272,067 B1 * | 9/2007 | Huang et al. | ............ | 365/225.7 |
| 2002/0060350 A1 | 5/2002 | Schulte et al. | | |
| 2002/0177266 A1 * | 11/2002 | Klein et al. | ............ | 438/200 |
| 2004/0114433 A1 * | 6/2004 | Forbes | ............ | 365/185.18 |
| 2006/0152272 A1 * | 7/2006 | Sueoka | ............ | 327/525 |

FOREIGN PATENT DOCUMENTS

EP 0960439 B1 12/1999
WO WO9836453 8/1998

OTHER PUBLICATIONS

Sedra et al., Microelectronic Circuits, Saunders College, Third edition, pp. 268-272.*
Sedra, Smith "Microelectronic Circuits", 1998.

* cited by examiner

*Primary Examiner*—Quan Tra

(57) ABSTRACT

In one embodiment, a method provides a bipolar junction transistor that is coupled to a first power supply. A second power supply is utilized to turn on the bipolar junction transistor. And, the bipolar junction transistor is overdriven.

51 Claims, 3 Drawing Sheets

TRANSISTOR ANTIFUSE DEVICE

BACKGROUND

Programmable read-only memory (PROM) devices can be used to store data. For example, a fuse can be used to store one bit of data. To program the fuse, sufficient voltage or current is applied to the fuse to cause the resistive link to melt open. During fuse programming, however, the surrounding circuitry can also be damaged, e.g., due to the relatively large energy used to melt the fuse link. Additional damage may be made when the PROM is utilized in environments where relatively low-voltage digital logic is mixed with high-voltage circuitry.

BRIEF DESCRIPTION OF THE DRAWINGS

The detailed description is described with reference to the accompanying figures. In the figures, the left-most digit(s) of a reference number identifies the figure in which the reference number first appears. The use of the same reference numbers in different figures indicates similar or identical items.

DETAILED DESCRIPTION

Various embodiments for provision and/or utilization of an antifuse are described. In one embodiment, a method provides a bipolar junction transistor (BJT) coupled to a first power supply. A second power supply is utilized to turn on the BJT. The BJT is overdriven, forming a filamentary short that may operate as an antifuse device. The antifuse device may be utilized in fluid ejection devices such as the print head of a printing device (e.g., an inkjet print head).

Antifuse Device Provision

Figure 1:
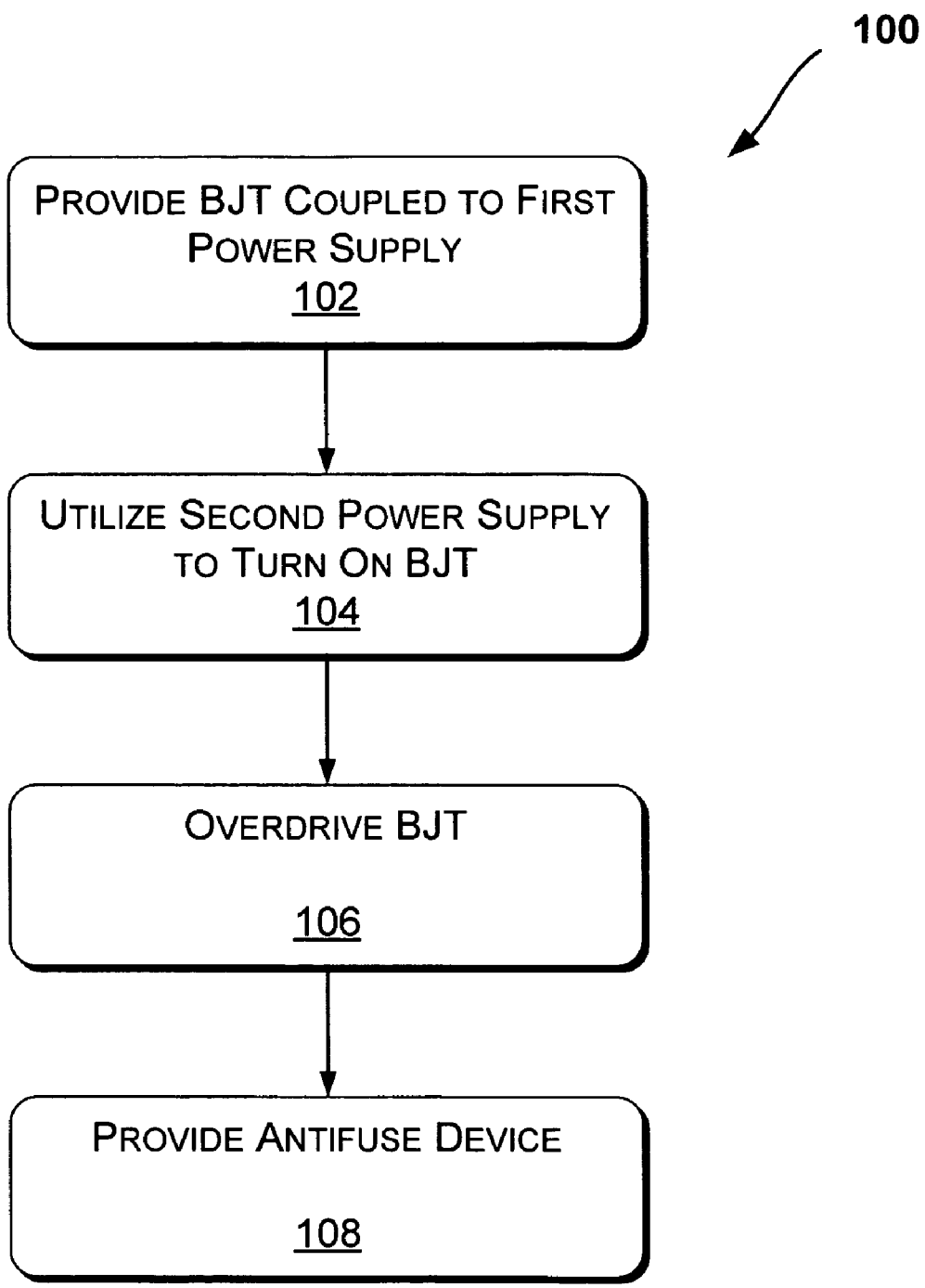
FIG. 1 illustrates a method of providing an antifuse device, according to an embodiment.
Figure 2:
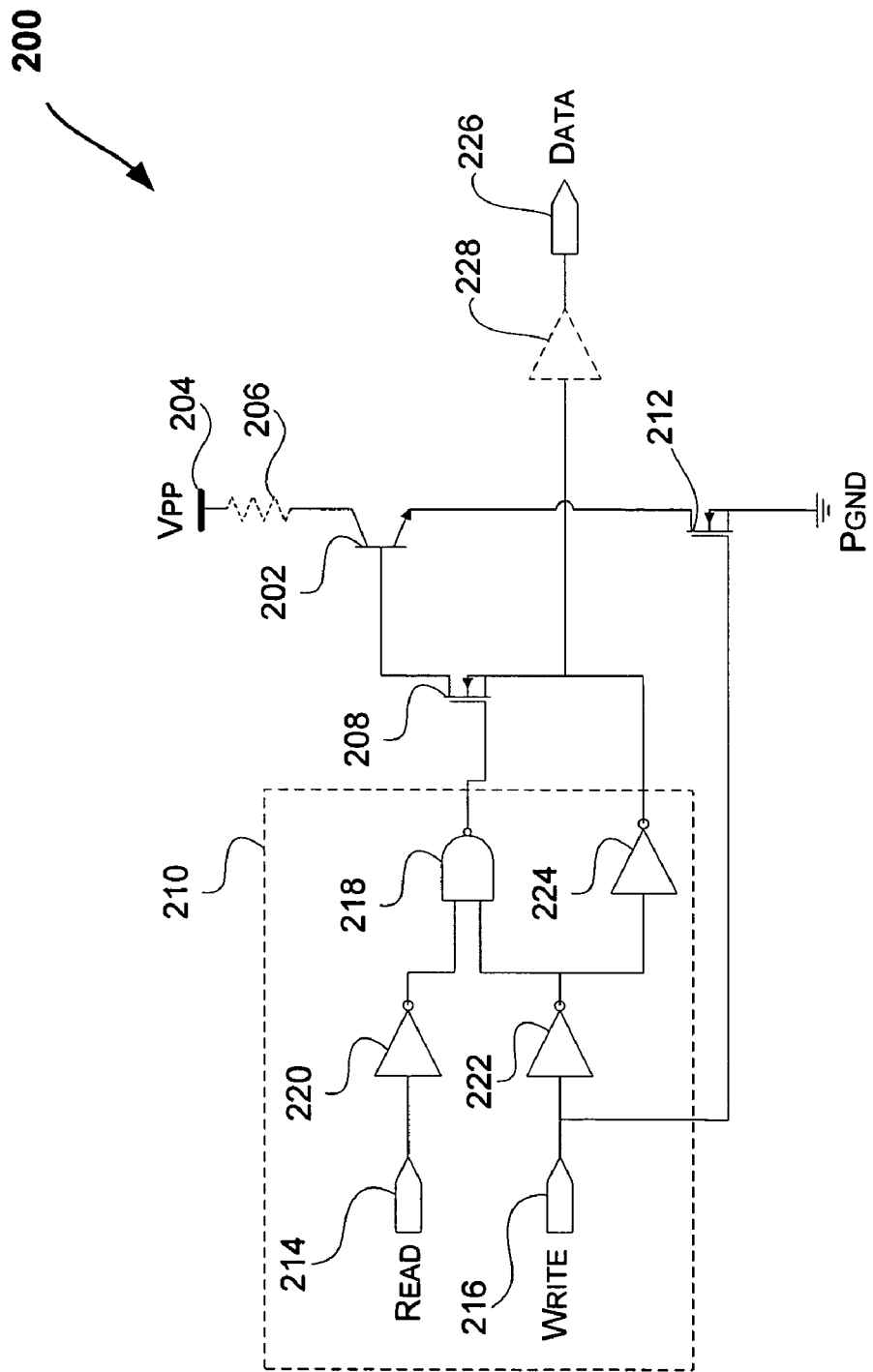
FIG. 2 illustrates a circuit that may be utilized to write and/or read an antifuse device, according to an embodiment.
Figure 3:
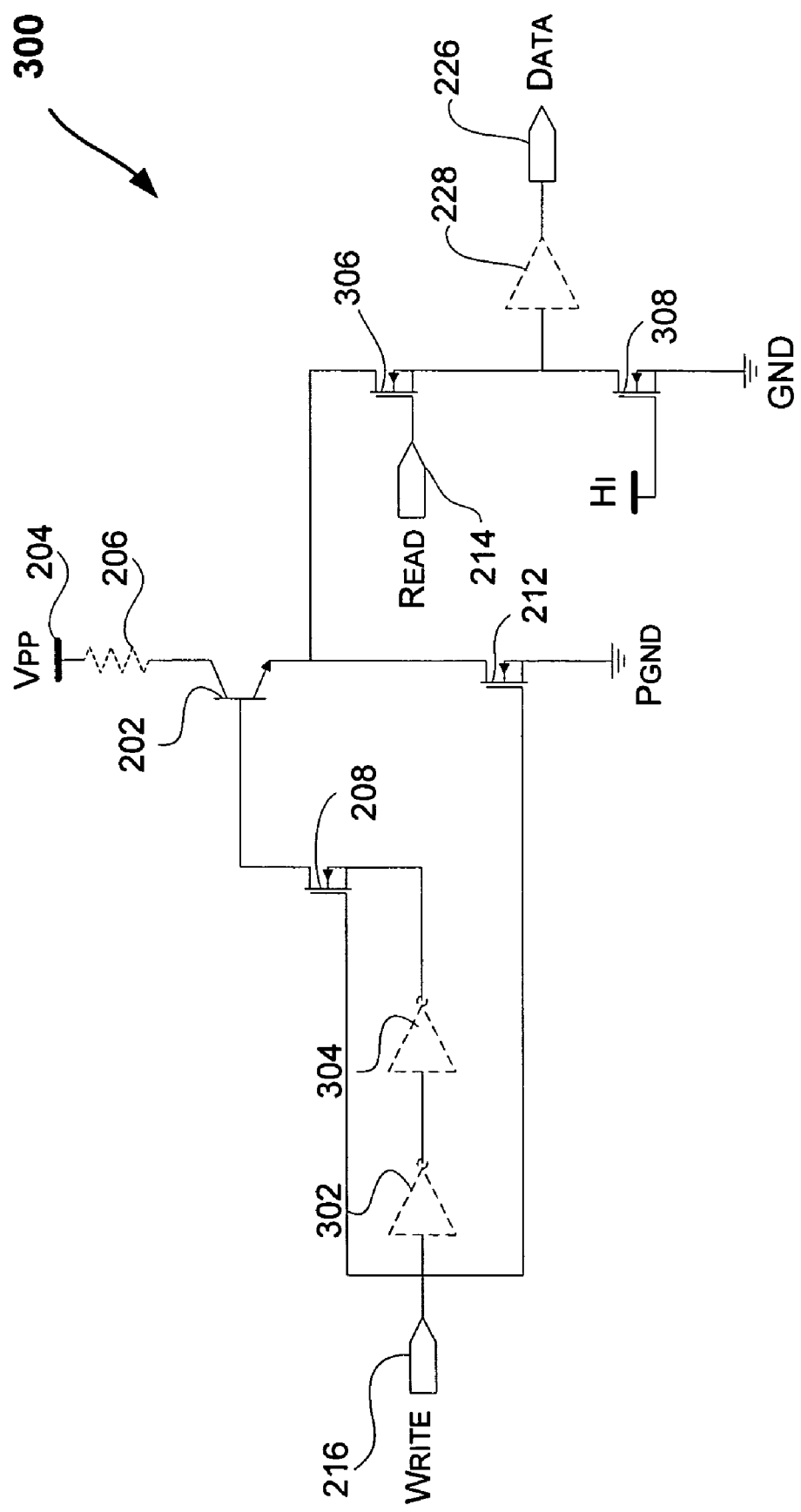
FIG. 3 illustrates another circuit that may be utilized to write and/or read an antifuse device, according to an embodiment.

FIG. 1 illustrates a method 100 of providing an antifuse device, according to an embodiment. The antifuse device may be utilized in fluid ejection devices such as the print head of a printing device (e.g., an inkjet print head). FIGS. 2 and 3 illustrate sample circuitry that may be utilized to perform the method 100, in accordance with various embodiments.

To program or write the antifuse device, the method 100 provides a BJT that is coupled to a first power supply (102). The first power supply provides a sufficiently high potential to drive a fluid ejection device in an embodiment. A second power supply is utilized to turn on the BJT (104). The first and second power supplies may be any suitable power supply such as a voltage supply or a current supply. A filamentary short in the BJT may then be provided by overdriving the BJT (106). The filamentary short in the BJT provides an antifuse device (108). The filamentary short is envisioned to substantially reduce the perceived resistance of the BJT, for example, reducing it from about $10^6$ Ohms to about 100 Ohms. This allows the BJT to be utilized as an antifuse device (or a PROM). In an embodiment, after overdriving the BJT (106), the filamentary short may be present between any nodes of the BJT, such as base-emitter, base-collector, and/or collector-emitter.

In one embodiment, the BJT may be any suitable transistor such as an NPN-type transistor or a PNP-type transistor. In an embodiment, the first power supply (e.g., Vpp) has a substantially higher voltage potential (e.g., about 30V) than the second power supply (e.g., Vdd at about 5V or less). Accordingly, by utilizing the two power supplies, no additional (negative) power supply is used for the programming the antifuse.

As will be further discussed with reference to FIGS. 2 and 3, the BJT may be isolated from circuit elements driven by the second power supply (e.g., Vdd) to limit damage to the circuit elements, since the BJT is also coupled to the relatively higher first power supply (e.g., Vpp). In an embodiment, one or more field-effect transistors (FETs) are coupled to the BJT. For example, the collector of the BJT may be coupled to the first power supply (e.g., Vpp) and the emitter and base of the BJT may be coupled to the FETs, as is further illustrated in FIGS. 2 and 3. In such embodiments, the stored value in the BJT may be read off of the BJT base (see, e.g., FIG. 2) and/or the BJT emitter (see, e.g., FIG. 3). Also, the circuits discussed with reference to FIGS. 2 and 3 may be provided on a semiconductor substrate. Also, since damage to the surrounding layers during writing of the BJT is envisioned to be minimal or absent, a metal routing layer may be provided over the semiconductor substrate.

Sample Antifuse Circuitry

FIG. 2 illustrates a circuit 200 that may be utilized to write and/or read an antifuse device, according to an embodiment. The antifuse device may be a BJT (202) such as discussed with reference to FIG. 1. The BJT 202 may be an NPN-type BJT.

The BJT 202 is coupled to a Vpp voltage supply (204), which is at about 30V in one implementation (e.g., the first voltage supply discussed with reference to FIG. 1). The BJT 202 may be coupled to the Vpp (204) through an optional resistor 206, which is envisioned to provide the clean burning of the filamentary short in the BJT 202 (such as discussed with reference to FIG. 1) and/or start ups of the circuit 200. In one embodiment, the resistor 206 has a value of about 100 Ohms.

In an embodiment, an NPN-type BJT (202) has Vceo=35.6V, Vces=39V, and Vcbo=39V. Thus with the base of the BJT 202 either grounded or open, the BJT 202 will not conduct substantially for collector to emitter voltages less than 35V, making the device appear as an open circuit. In addition, no current can flow from the collector to the base for collector-to-base voltages less than 39V. However, when a base current is supplied to the BJT 202, thereby turning it on (e.g., see stage 104 of FIG. 1), the device can be caused to fail at collector-emitter voltages as low as about 20V (e.g., see stage 106 of FIG. 1). Moreover, as discussed with reference to FIG. 1, the formation of a filamentary collector-to-emitter short through the base of the device may connect all three terminals of the device.

Writing/Programming Antifuse

To program or write the BJT 202, a base current is supplied to the BJT 202, thereby turning it on (e.g., see stage 104 of FIG. 1), while the BJT 202 is overdriven. More specifically, a FET 208 is forward-biased by a read/write logic circuitry 210, thereby turning on the BJT 202. The read/write logic circuitry also turns on a FET 212, allowing current to flow through the BJT 202 to overdrive it. In various embodiments, the FETs 208 and 212 may be any suitable N-channel FETs, such as laterally diffused metal oxide semiconductor (LDMOS) devices.

In embodiments that are utilized in a fluid ejection device (such as an inkjet printer), the heater resistor supply (e.g., Vpp 204) may be used to program one or more fuse devices (202).

The logic circuitry that reads the antifuse value, however, may be powered by a Vdd logic supply (not shown), e.g., the second voltage supply discussed with reference to FIG. 1. Since a programmed BJT (202) antifuse results in one or more of its three terminals being shorted, this implies that the logic circuitry (e.g., 210) connected to the programmed device (202) may receive voltages as high as the (30V) Vpp voltage supply (204). This situation is not limited to fluid ejection devices and may also be present whenever the first and second voltage supplies differ, such as discussed with reference to FIG. 1. Furthermore, as previously indicated, it is also envisioned that any suitable type of power supply may be utilized to write/read the BJT 202, such as a current supply or voltage supply.

To avoid damaging the logic circuitry (e.g., 210) which is designed for lower voltage levels (e.g., Vdd of about 5V), a drain of the FET 208 is connected to the base of the BJT 202. The source and gate of the FET 208 are driven by read/write logic circuitry 210, which utilizes a Vdd of about 5V (e.g., the second power supply discussed with reference to FIG. 1).

As illustrated in FIG. 2, the logic circuitry 210 receives read and write signals (on nodes 214 and 216, respectively) which are coupled to a NAND gate 218 through invertors (220, 222). In one embodiment, the assertion of the read and write signals (214 and 216), respectively, indicates whether a write or read cycle is in progress. The output of the NAND gate 218 is coupled to the gate of the FET 208. In an embodiment, the simultaneous assertion of both read and write signals (214 and 216) is disallowed. However, it is also envisioned that the NAND gate 218 may be replaced with an exclusive NOR gate to treat situations where simultaneous assertion of both read and write signals (214 and 216) is allowed. Accordingly, when Vgs of the FET 208 is ≦0V, raising the source voltage above the drain voltage on the FET 208 device will forward bias the parasitic PN junction in the FET 208. Since the FET 208 is connected to the base of the BJT 202, it can be used to supply current into the base of the BJT 202, thereby turning the BJT 202 fully on. With sufficient collector to emitter voltage on the BJT 202, the current capacity of the BJT 202 (passing through the FET 212) is exceeded and the collector, base, and/or emitter junctions of the BJT 202 are shorted out via formation of a filament defect, thus resulting in programming of the BJT 202.

Once the BJT 202 is programmed, the drain of the FET 208 device will rise to Vpp 204, turning off the parasitic diode of FET 208. The FET 208 will again operate as a high voltage FET, thereby isolating the logic circuitry 210 from the Vpp voltage 204.

Reading Stored Value Antifuse

To read the stored value of the BJT 202, the FET 208 is turned on (when the read signal (214) is asserted and the write signal (216) is non-asserted) and an inverter 224 connected to the source of the FET 208 attempts to pull the source to ground. The pull down current drive of this inverter (224) may be set to be relatively low, e.g., by choosing a small size. If the BJT 202 is shorted, the current flowing into the FET 208 will be large enough that the voltage at an output (226) of the circuit 200 will rise to Vdd, thus indicating a programmed BJT 202. If the BJT 202 is not programmed, the base of the BJT 202 is isolated from Vpp and no current will flow into the FET 208, thereby allowing the inverter 224 to pull the output node 226 to ground (since the write signal (216) is not asserted during the read cycle), thus indicating an unprogrammed device. In one embodiment, an optional buffer 228 may be utilized to buffer the signal provided to the output node 226.

Alternate Antifuse Circuitry

FIG. 3 illustrates a circuit 300 that may be utilized to write and/or read an antifuse device, according to an embodiment. The circuit 300 includes the BJT 202, the Vpp voltage supply 204, the optional resistor 206, the FETs 208 and 212, the read and write signals nodes 214 and 216, the output node 226, and optional buffer 228 such as discussed with reference to FIG. 2.

To write or program the BJT 202, the write signal (216) is asserted, which forward biases the parasitic PN junction of FET 208 (e.g., through two optional invertors 302 and 304). The write signal (216) also turns on the FET 212, thereby allowing the BJT 202 to be overdriven (such as discussed with reference to FIGS. 1 and 2).

To read the stored value of the BJT 202, the read signal (214) is asserted which turns on a FET 306. A FET 308 connected to the output node 226 attempts to pull the output node 226 to ground (since its gate is held at a high value, i.e., turning on the FET 308). The pull down current drive of this FET (308) may be set to be relatively low by choosing a relatively small size FET. In various embodiments, the FETs 306 and 308 may be any suitable N-channel FETs, such as laterally diffused metal oxide semiconductor (LDMOS) devices.

If the BJT 202 is shorted, the current flowing into the FET 308 will be large enough that the device will saturate and the voltage at an output (226) of the circuit 300 will rise to Vdd, thus indicating a programmed BJT 202. If the BJT 202 is not programmed, the emitter of the BJT 202 is isolated from Vpp and no current will flow into the FET 306, thereby allowing the FET 308 to pull the output node 226 to ground, thus indicating an unprogrammed device.

In one embodiment, such as discussed with reference to FIGS. 2 and 3, a transistor (such as the FET 208) may be coupled to both low-voltage and high-voltage circuitry. The transistor isolates the low and high voltage circuitry from each other, e.g., to protect the low-voltage circuitry from the high-voltage circuitry. As discussed with reference to the FET 208, the transistor may be an n-channel, high-voltage FET. More specifically, the transistor may be utilized as a diode in a first bias condition and as a field-effect transistor in a second bias condition. Furthermore, the transistor may automatically transition from the diode action to the FET action when the drain voltage of the transistor rises above the source voltage of the transistor, e.g., to protect the low-voltage circuitry from the high-voltage circuitry.

Although described embodiments use N-channel FETs and NPN BJTs, this is not meant to limit the scope of the invention to n-type devices. Circuits of similar function can be designed using P-channel FETs and PNP BJTs.

Reference in the specification to "one embodiment" or "an embodiment" means that a particular feature, structure, or characteristic described in connection with the embodiment is included in at least an implementation. The appearances of the phrase "in one embodiment" in various places in the specification are not necessarily all referring to the same embodiment.

Thus, although embodiments have been described in language specific to structural features and/or methodological acts, it is to be understood that claimed subject matter may not be limited to the specific features or acts described. Rather, the specific features and acts are disclosed as sample forms of implementing the claimed subject matter.

What is claimed is:

1. A method comprising:
   providing a bipolar junction transistor coupled to a first power supply;

utilizing a second power supply to turn on the bipolar junction transistor;

overdriving the bipolar junction transistor, wherein overdriving of the bipolar junction transistor generates a filamentary short defect in the bipolar junction transistor, and wherein the filamentary short defect provides an antifuse device; and coupling the second power supply to the bipolar junction transistor via a plurality of invertors.

2. The method of claim 1, wherein the overdriving of the bipolar junction transistor generates a filamentary short in a collector-emitter junction of the bipolar junction transistor.

3. The method of claim 1, further comprising reading a value of the antifuse device from at least one of a base node and an emitter node of the bipolar junction transistor.

4. The method of claim 1, wherein the first power supply has a substantially higher voltage potential than the second power supply.

5. The method of claim 1, further comprising isolating the bipolar junction transistor from circuit elements driven by the second power supply to limit damage to the circuit elements.

6. The method of claim 1, wherein the first power supply provides a sufficiently high voltage potential to drive a fluid ejection device, wherein the first power supply is to drive a heater resistor of the fluid ejection device.

7. The method of claim 6, wherein the fluid ejection device is a print head.

8. The method of claim 7, wherein the print head is utilized in an inkjet printing device.

9. The method of claim 1, wherein the bipolar junction transistor is selected from a group comprising an NPN-type transistor and a PNP-type transistor.

10. The method of claim 1, further comprising isolating the bipolar junction transistor from circuit elements driven by the second power supply.

11. The method of claim 10, wherein the isolating is performed by coupling the bipolar junction transistor to a plurality of field-effect transistors.

12. The method of claim 10, wherein the first and second power supplies are selected from a group comprising current supplies and voltage supplies.

13. An apparatus comprising:

a bipolar junction transistor coupled to a first power supply and a second power supply, wherein, to write the bipolar junction transistor, the bipolar junction transistor is overdriven while the bipolar junction transistor is turned on and wherein a filamentary short defect is formed in the bipolar junction transistor after the bipolar junction transistor is overdriven, wherein the filamentary short defect provides an antifuse device, and wherein the second power supply is coupled to the bipolar junction transistor via a plurality of invertors.

14. The apparatus of claim 13, wherein the bipolar junction transistor is turned on by coupling the second power supply to a base of the bipolar junction transistor.

15. The apparatus of claim 13, wherein the bipolar junction transistor is overdriven by coupling the first power supply to a collector of the bipolar junction transistor while the bipolar junction transistor is turned on.

16. The apparatus of claim 13, wherein the apparatus is provided on a semiconductor substrate.

17. The apparatus of claim 14, wherein a metal routing layer is provided over the semiconductor substrate.

18. The apparatus of claim 13, further comprising a filamentary short in a collector-emitter junction of the bipolar junction transistor formed after the bipolar junction transistor is overdriven.

19. The apparatus of claim 13, wherein a value of the antifuse device is read from at least one of a base node and an emitter node of the bipolar junction transistor.

20. The apparatus of claim 13, wherein the first power supply has a substantially higher voltage potential than the second power supply.

21. The apparatus of claim 20, further comprising a plurality of field-effect transistors to isolate the bipolar junction transistor from circuit elements driven by the second power supply.

22. The apparatus of claim 13, further comprising a heater resistor, wherein the first power supply provides a sufficiently high voltage potential to drive a fluid ejection device, wherein the first power supply is to drive the heater resistor associated with the fluid ejection device.

23. The apparatus of claim 22, wherein the fluid ejection device is a print head.

24. The apparatus of claim 23, wherein the print head is utilized in an inkjet printing device.

25. The apparatus of claim 13, wherein the bipolar junction transistor is selected from a group comprising an NPN-type transistor and a PNP-type transistor.

26. The apparatus of claim 13, wherein the first and second power supplies are selected from a group comprising current supplies and voltage supplies.

27. An apparatus comprising:

a bipolar junction transistor coupled to a first power supply and a second power supply; and a plurality of field-effect transistors coupled to the bipolar junction transistor to isolate the bipolar junction transistor from circuit elements driven by the second power supply, wherein the bipolar junction transistor is overdriven while the bipolar junction transistor is turned on to burn a filamentary short defect in the bipolar junction transistor, and wherein the bipolar junction transistor is turned on by coupling the second power supply to a base of the bipolar junction via a plurality of invertors.

28. The apparatus of claim 27, wherein the first power supply has a substantially higher voltage potential than the second power supply.

29. The apparatus of claim 27, further comprising a heater resistor, wherein the first power supply provides a sufficiently high voltage potential to drive a fluid ejection device, wherein the first power supply is to drive the heater resistor associated with the fluid ejection device.

30. The apparatus of claim 29, wherein the fluid ejection device is a print head.

31. The apparatus of claim 30, wherein the print head is utilized in an inkjet printing device.

32. The apparatus of claim 27, wherein the plurality of invertors are coupled to the bipolar junction transistor via a source of one of the plurality of field-effect transistors.

33. The apparatus of claim 27, wherein the apparatus is provided on a semiconductor substrate.

34. The apparatus of claim 33, wherein a metal routing layer is provided over the semiconductor substrate.

35. The apparatus of claim 27, wherein the filamentary short defect provides an antifuse device.

36. The apparatus of claim 35, wherein a value of the antifuse device is read from at least one of a base node and an emitter node of the bipolar junction transistor.

37. The apparatus of claim 27, wherein the bipolar junction transistor is selected from a group comprising an NPN-type transistor and a PNP-type transistor.

38. The apparatus of claim 27, wherein the first and second power supplies are selected from a group comprising current supplies and voltage supplies.

39. An apparatus comprising:
a first transistor coupled to low-voltage and high-voltage circuitry, the first transistor isolating the low and high voltage circuitry from each other;
a bipolar junction transistor; and
wherein the first transistor is utilized as a diode in a first bias condition and as a field-effect transistor in a second bias condition and wherein the bipolar junction transistor is overdriven while the bipolar junction transistor is turned on to create a programmed antifuse device, and wherein a plurality of invertors are coupled to a base of the bipolar junction transistor via the first transistor.

40. The apparatus of claim 39, wherein the first transistor is a high-voltage field-effect transistor.

41. The apparatus of claim 39, wherein the first transistor is a high-voltage n-channel field-effect transistor.

42. The apparatus of claim 39, wherein the first transistor automatically transitions from a diode action to a field-effect transistor action when a drain voltage of the first transistor rises above a source voltage of the transistor.

43. The apparatus of claim 42, wherein the first transistor automatically transitions from a diode action to a field-effect transistor action when a drain voltage of the first transistor rises above a source voltage of the first transistor to protect the low-voltage circuitry from the high-voltage circuitry.

44. The apparatus of claim 39, wherein the plurality of invertors are coupled to the bipolar junction transistor via a source of the first transistor and wherein a drain of the first transistor is coupled directly to the base of the bipolar junction transistor.

45. An apparatus comprising:
means for coupling a bipolar junction transistor to a first power supply;
means for utilizing a second power supply, coupled to the first power supply via a plurality of signal inverting means, to turn on the bipolar junction transistor; and
means for overdriving the bipolar junction transistor using the first power supply while the bipolar junction transistor is turned on by the means for utilizing a second power supply, wherein overdriving of the bipolar junction transistor generates a programmed antifuse device.

46. The apparatus of claim 45, further comprising means for reading a value stored by the bipolar junction transistor.

47. The apparatus of claim 45, further comprising means for isolating the bipolar junction transistor from circuit elements driven by the second power supply.

48. The method of claim 1, further comprising increasing a value of the second power supply while a value of the first power supply is maintained.

49. The method of claim 1, wherein overdriving the bipolar junction transistor causes a filamentary short between all terminals of the bipolar junction transistor.

50. The method of claim 1, wherein the plurality of invertors are coupled to the bipolar junction transistor via a source of a field-effect transistor and wherein a drain of the field-effect transistor is coupled to a base of the bipolar junction transistor.

51. The apparatus of claim 13, wherein the plurality of invertors are coupled to the bipolar junction transistor via a source of a field-effect transistor and wherein a drain of the field-effect transistor is coupled to a base of the bipolar junction transistor.

\* \* \* \* \*